Oct. 12, 1965 G. A. CASTELLION 3,211,517

SEMICONDUCTING MATERIALS

Filed Aug. 26, 1963 2 Sheets-Sheet 1

INVENTOR.
GEORGE A. CASTELLION

BY John E. Hanrahan

ATTORNEY

Oct. 12, 1965 G. A. CASTELLION 3,211,517

SEMICONDUCTING MATERIALS

Filed Aug. 26, 1963 2 Sheets-Sheet 2

INVENTOR.
GEORGE A. CASTELLION
BY
John E. Hamilton
ATTORNEY

United States Patent Office 3,211,517

Patented Oct. 12, 1965

3,211,517

SEMICONDUCTING MATERIALS

George A. Castellion, Stamford, Conn., assignor to American Cyanamid Company, Stamford, Conn., a corporation of Maine

Filed Aug. 26, 1963, Ser. No. 304,344

4 Claims. (Cl. 23—14)

This invention relates to new semiconducting materials and their use in solid state semiconductor devices.

Solid state semiconductor devices are in general well known and are characterized by a body, usually crystalline, of an electrically semiconducting substance which is subjected to electrical or magnetic fields, to corpuscular or wave radiation, or to a plurality of such phenomena for producing electrical, photoelectrical, optical or other physical effects. Typically, such devices include transistors, thermistors, rectifiers, diodes, photocells, photoconductors, radiation detectors, thermocouples, thermoelectric generators, and Peltier cooling cells, among others.

As a general rule, semiconductor materials of the kind most suited for use as thermoelectric materials should have a mean atomic weight as high as possible. This conclusion is expressed by Goldsmid in the text Applications of Themoelectricity, published by J. Wiley and Sons (1960). In this connection, bismuth telluride ($Bi_2Te_3$), one of the most efficient thermoelectric materials currently known, has a mean atomic weight of 158 and a thermoelectric figure of merit (Z) equal to $2.3\times10^{-3}$ $°\ K.^{-1}$.

As noted, bismuth telluride as well as other thermoelectric materials containing the tellurium atoms as anions probably comprise the most efficient thermoelectric materials presently known. Tellurium is, however, a costly and uncommon element, which considerations greatly reduce its potential use in thermoelectric devices.

As a general rule, it is known that compositions or alloys of two or more semiconducting materials can have thermal conductivities lower than that of either of their constituent compounds alone. However, as it is noted by Heikes and Ure in Thermoelectricity, Science and Engineering Interscience Publishers (1961), the increase in the figure of merit by alloying thermoelectric materials has not been much larger than 10 to 25%.

It is an object of the present invention to provide novel semiconductor materials which, while characterized by relatively low mean atomic weights, are surprisingly characterized by high thermoelectric figures of merit (Z) which are comparable to those of the most efficient thermoelectric materials available today, i.e., those containing tellurium in the anion portion, as for example bismuth telluride ($Bi_2Te_3$).

A further object of the present invention is to provide novel and efficient thermoelectric materials employing elements which are abundant and available at low cost.

A still further object of the present invention is to provide novel and efficient semiconducting materials containing the elements of two known semiconducting compounds in which the thermoelectric figure of merit is a value which may rise to be twice as high or more than that of the two individual known semiconducting compounds.

Figure 3:
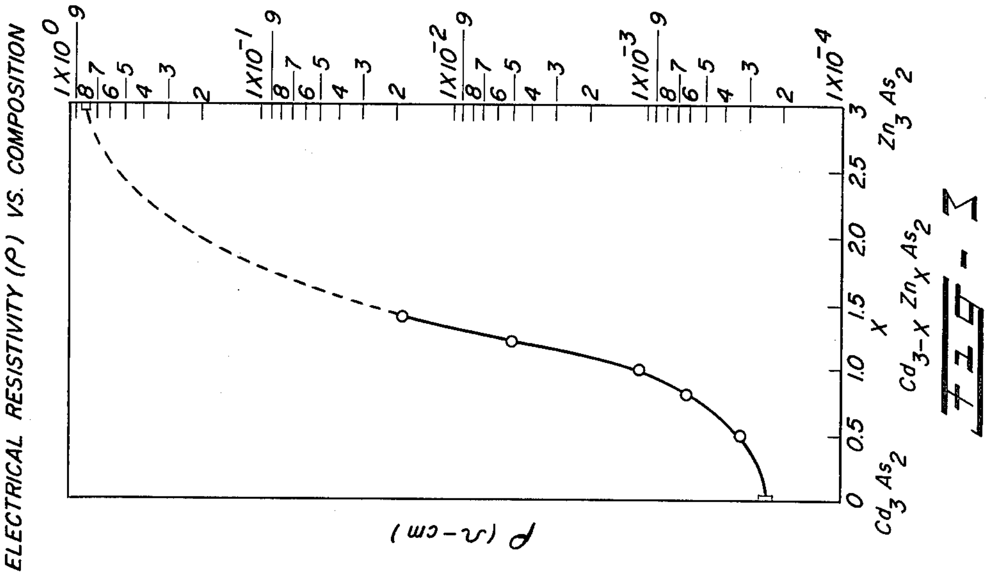
Figure 1:
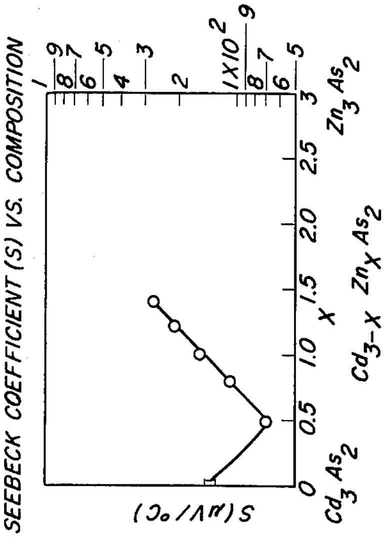
Figure 2:
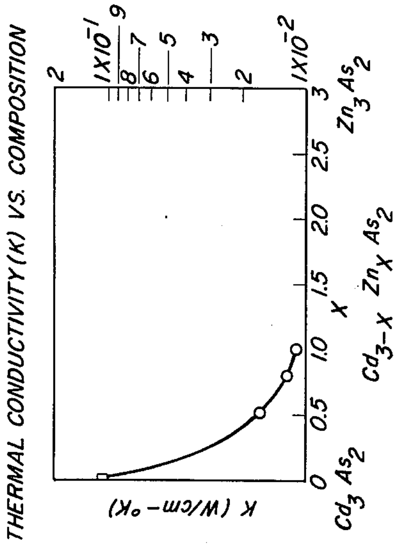
Figure 4:
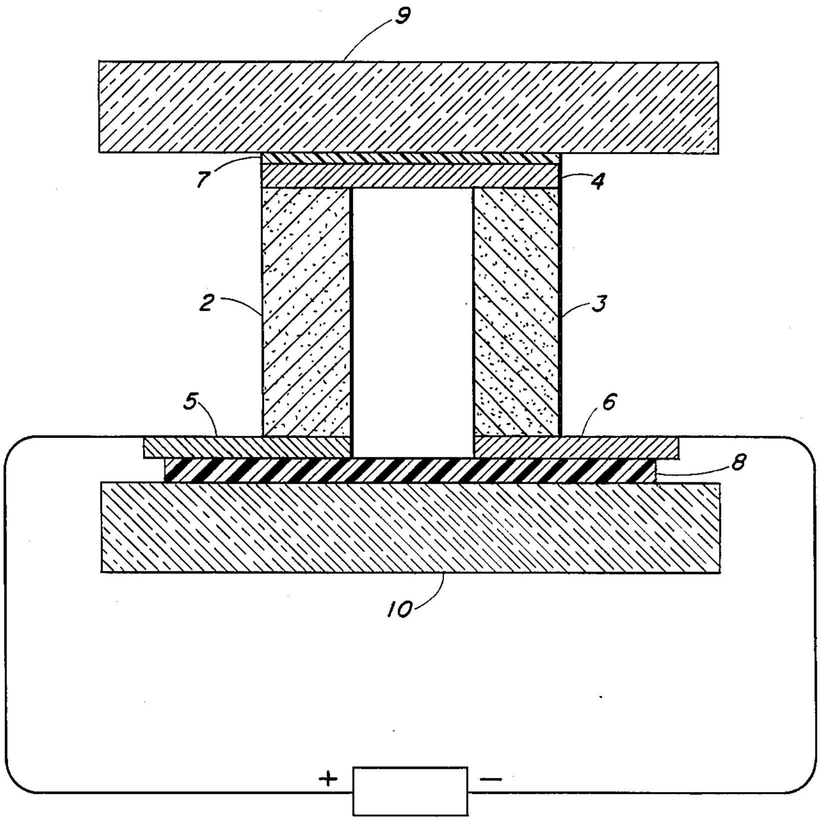

These and other objects and advantages of the present invention will become more apparent from the detailed description thereof set forth hereinbelow and by reference to the accompanying drawings, in which FIGS. 1, 2 and 3 are curves in which the Seebeck coefficient (S), thermal conductivity (K) and electrical resistivity ($\rho$) of the semiconductor materials of this invention are plotted as a function of composition. These properties of known semiconducting compounds $Cd_3As_2$ and $Zn_3As_2$, as they are reported from published literature, are also shown in FIGS. 1, 2 and 3. FIG. 4 is a typical thermoelectric device, as for refrigeration by the Peltier effect.

According to this invention, semiconductor materials are provided of the formula $$Cd_{3-x}Zn_xAs_2$$

where x is a value of from about .1 to about 2.9 and preferably is a value of from .1 to 1.

The preferred material of this invention is $Cd_2ZnAs_2$.

In preparing the semiconductor materials, the elements are broken up into particle sizes that can be easily worked with. In the case of arsenic, it has been my experience that the particle sizes should be less than 6 millimeters in diameter and preferably a particle size of about 1 millimeter in diameter. The elements are mixed in stoichiometric amounts, loaded into a crucible which is evacuated and sealed and thereafter subjected to elevated temperatures. This is normally accomplished by placing the crucible containing the mixed elements present into a furnace and heating to a temperature above the melting point of the compound to be prepared, i.e., a temperature of from about 720 to 1050° C. Usually, the time required to raise the temperature from room to the temperature range indicated is from about 30 minutes to 2 hours. A time of 1 hour seems satisfactory in most instances and avoids the danger of explosion resulting from the vapor pressure build-up of unreacted arsenic.

The temperatures are those sufficient to insure that the contents of the crucible will be liquid and, as noted above, within the range of about 720 to about 1050° C. While the contents of the crucible are in the liquid state, they are intimately mixed as by the rocking of the crucible-containing furnace. This insures the uniform character of the final product. Temperatures higher than about 1050° C. can result in the dissociation of the components, while if temperatures below that indicated are employed the times required to produce the semiconducting materials of this invention would probably be of the order of weeks, months or even years.

As noted above, while the contents of the crucible are in a liquid stage, the elements or compounds are intimately mixed as by rocking the crucible-containing furnace. This period, which may be termed the mixing period, usually lasts for from about 1–3 hours. Longer times increase the amount of etching of the crucible wall by the elements.

After the mixing period, the semiconductor compositions of this invention are cooled at rates of from approximately 2° to 20° C. per hour. This rate of cooling is continued until a temperature of about 400° C. is arrived at, from which point the cooling is carried out at a rate of from 80–100° C. per hour. It has been my experience that cooling slowly in the upper regions permits single crystal growth while passing through the freezing point and prevents cracking of the crystals while going through a solid-solid phase transition in the lower temperature range, i.e., 700° C. to 550° C.

It is quite surprising that the simple process outlined above produces large single crystals which usually require elaborate techniques such as crystal pulling or Bridgman method.

The samples prepared, as more fully illustrated hereinafter, have for the most part been determined by microscopical and/or X-ray examination or analysis to be single phase. In the X-ray analysis, X-ray diffraction patterns were made on powdered samples and within experimental error the variation of the interplanar spacings was linear. The powder photographs suggest that the samples prepared show the occurrence of solid solutions between $Cd_3AS_2$ and $Zn_3As_2$.

In the determination of the thermoelectric figure of merit in accordance with the formula $$Z=\frac{S^2}{K\rho}$$

the parameters are obtained as follows:

SEEBECK COEFFICIENT (S)

The Seebeck coefficient was measured by placing one end of a cylindrical specimen on a copper block cooled by an ice water mixture. A second copper block heated to a few degrees above room temperature was pressed against the opposite end of the specimen. The potential difference and the temperature difference between the hot end and the cold end of the specimen were measured and the Seebeck coefficient calculated.

ELECTRICAL RESISTIVITY ($\rho$)

Electrical resistivity was measured by passing a current through a cylindrical specimen and measuring the voltage drop between two probes pressed on the surface parallel to the axis of the specimen. A resistivity measuring apparatus of the type described by Dauphineee and Mooser [Review of Scientific Instruments, 26, 660 (1955)] was used to avoid errors caused by the Peltier effect.

THERMAL CONDUCTIVITY (K)

The thermal conductivity was obtained by clamping cylindrical specimens between a heat source and a heat sink in an evacuated container that is kept at a fixed constant temperature. The temperature of the heat source is also constant and always higher than that of the container. At equilibrium temperature, all of the heat that flows from the heat source through the sample to the heat sink is radiated to the container walls. The temperature of the heat sink with a given emissivity is then only a function of the sample thermal conductivity. The method is standardized using specimens of known thermal conductivity. The results for the semiconductor materials of this invention obtained by this method agree well with those obtained on the compounds by the modified Harman method described by Herinck and Monfils in the British Journal of Applied Physics, 10, 235 (1959).

In order to illustrate the present invention, the following examples are given primarily by way of illustration. No specific details or enumerations contained therein should be construed as limitations on the present invention except insofar as they appear in the appended claims. All parts and percentages are by weight unless otherwise specifically designated.

*Example 1*

Into a crucible of quartz tubing 6.7440 grams of cadmium, 1.9611 grams of zinc were placed and the crucible was evacuated to a pressure of less than $1\times10^{-3}$ Torr. 4.4952 grams of arsenic under an inert atmosphere was loaded into a side arm and dropped into the crucible. The crucible was evacuated to a pressure of less than $1\times10^{-3}$ Torr and then filled with hydrogen to a pressure of 20 Torr.

The crucible was then sealed and placed in the holder in a resistance furnace. The furnace was rocked gently to and fro and its temperature was raised to 900° C. After being heated at 900° C. for 3 hours, the rocking of the furnace was stopped and the power to the furnace was reduced. The temperature of the furnace was lowered at a steady rate from 850° C. to 440° C. over a period of 24 hours. Power to the furnace was then shut off and the furnace was allowed to cool to room temperature.

Microscopical examination and X-ray analysis showed that the resulting sample was single phase. A specimen of the sample was found to be a semiconductor with the following properties:

Seebeck coefficient (S) $=152$ $\mu$v./° C.
Electrical resistivity ($\rho$) $=1.1\times10^{-3}\Omega$-cm.
Thermal conductivity (K) $=.0108$ watts/cm. ° K.

Thermoelectric figure of merit $(Z)\frac{S^2}{K\rho}=1.94\times10^{-3}\ °K.^{-1}$ The semiconductor material has the composition $Cd_2ZnAs_2$.

*Example 2*

A sample of material of the composition $Cd_{2.5}Zn_{0.5}As_2$ was prepared in the manner described in Example 1 with the exception that 14.0500 grams of cadmium, 1.6343 grams of zinc and 7.4920 grams of arsenic were employed.

Microscopical examination and X-ray analysis showed that the resulting sample was a single phase.

A specimen of the sample was found to be a semiconductor with the following properties:

$S=68$ $\mu$v./° C.
$\rho=0.31\times10^{-3}\Omega$-cm.
$K=.0170$ watts/cm. ° K.
$Z=0.85\times10^{-3}$ ° K.$^{-1}$

*Example 3*

A sample having the composition $Cd_{2.2}Zn_{0.8}As_2$ was prepared employing the procedure of Example 1 except that 12.3640 grams of cadmium, 2.6148 grams of zinc and 7.4920 grams of arsenic were employed.

Microscopical examination and X-ray analysis showed that the resulting sample was single phase.

A specimen of the sample was found to be a semiconductor with the following properties:

$S=103$ $\mu$v./° C.
$\rho=0.6\times10^{-3}\Omega$-cm.
$K=.0120$ watts/cm.-° K.
$Z=1.45\times10^{-3}$ ° K.$^{-1}$

*Example 4*

A sample having the formula $Cd_{1.6}Zn_{1.4}As_2$ was prepared in accordance with the procedure outlined in Example 1, except that 5.3952 grams of cadmium, 2.7456 grams of zinc, and 4.4952 grams of arsenic were employed in the preparation.

Microscopical examination showed that the resulting sample was single phase.

A specimen of the sample was found to be a semiconductor with the following properties:

$S=272$ $\mu$v./° C.
$\rho=18\times10^{-3}\Omega$-cm.

*Example 5*

A sample having the formula $Cd_{1.8}Zn_{1.2}As_2$ was prepared in the manner described in Example 1, except that 6.0696 grams of cadmium, 2,3532 grams of zinc and 4.4952 grams of arsenic were employed.

Microscopical examination and X-ray analysis showed that the resulting sample was single phase.

A specimen of the sample was found to be a semiconductor with the following properties:

$S=208\mu$/v.° C.
$\rho=5\times10^{-3}\Omega$-cm.

The sample of the preparation of Example 1 was almost entirely a single crystal. Large crystal units were observed in the ingots of the compositions $Cd_{2.5}Zn_{0.5}As_2$ and $Cd_{2.2}Zn_{0.8}As_2$. The crystal units in the ingots of compositions $Cd_{1.8}Zn_{1.2}As_2$ and $Cd_{1.6}Zn_{1.4}As_2$ were smaller.

X-ray diffraction patterns were made on powdered samples prepared in the examples above. Within experimental error, the variation of the interplanar spacings was linear. The powder photographs suggest that the compositions prepared may be regarded as solid solutions between $Cd_3As_2$ and $Zn_3As_2$. It is noteworthy, however that Weissenberg patterns of a single crystal of the composition $Cd_2ZnAs_2$ show evidence of a larger unit cell than that of $Cd_3As_2$ or $Zn_3As_2$.

An approximation of the quality of a thermoelectric material may be made by relating the electrical resistivity, Seebeck coefficient, and thermal conductivity in an approximate figure of merit Z, defined as $$Z=\frac{S^2}{\rho K}$$

FIGS. 1, 2 and 3 compare the properties of the semiconducting material of this invention as against the published literature values for the semiconducting compounds $Cd_3As_2$ and $Zn_3As_2$ as reported in Physical Review, 121, 759 (1961). They demonstrate that although the electrical resistivities of the semiconducting materials of this invention are higher than that of $Cd_3As_2$, their Seebeck coefficients and thermal conductivities can combine to give an increased figure of merit.

In connection with FIGS. 1, 2 and 3, the semiconductor materials of this invention and in particular the material $Cd_2ZnAs_2$ has a thermoelectric figure of merit of $1.94\times10^{-3}$ ° K.$^{-1}$, while the figure of merit for $Cd_3As_2$ obtained from published data is $0.82\times10^{-3}$ ° K.$^{-1}$.

Since the electric properties of the compositions of this invention are affected by departures from the stoichiometry disclosed, raw materials of the highest purity are normally employed. Influencing of electric properties may be achieved by the inclusion of various impurities or dopes or planned variations in the stoichiometry recited.

It is well known that semiconductor materials which have successive zones of different electrical properties are of particular significance for various practical applications. For instance, a semiconductor material which in one zone is an excess electron (n-type) conductor and in the adjacent zone a defect-electron conductor (hole conductor, p-type) is in general suited as a rectifier. Further, a semiconductor having an excess electron conductance or n-type zone followed by a defect-electron conductance or p-type zone and again followed by an n-type zone is useful as a controllable resistor. In this respect, reference is made to those devices that have become known as transistors.

It has been stated that in the British Journal of Applied Physics, 12, 86 (1961) that as a general rule if a material is to be useful for galvanomagnetic applications, such as gauss meters and clip-on ammeters, the carrier mobility must be high and the carrier concentration low. The semiconducting materials of this invention have a high carrier mobility; for example, the $Cd_{2.5}Zn_{0.5}As_2$ sample prepared had an electron mobility of 8,100 cm.$^2$/v.-sec. at room temperature. By use of doping agents, the carrier concentration can be adjusted resulting in galvanomagnetic devices of increased sensitivity.

In general, the semiconductive properties of the composition $Cd_{3-x}Zn_xAs_2$ may be changed by doping in accordance with accepted doping procedures. Copper, silver and germanium act as acceptors when added as impurities to these compounds, while gallium, selenium and tellurium act as donors when added as impurities. A .01 weight percent excess arsenic when added to the quantities listed for the preparation of the composition $Cd_2ZnAs_2$ acted as an acceptor under the conditions of synthesis described in Example 1 above.

Further increases in the figure of merit may be achieved by alloying $Cd_{3-x}Zn_xAs_2$ with other elements and compounds. For example, the composition:

$$Cd_{3-x}Zn_xAs_{2-y}Sb_y$$

or $Cd_{3-x}Zn_{x-y}Hg_yAs_2$.

In view of the fact that the semiconductive compositions of this invention have high thermoelectric figures of merit, they have particular utility in thermoelecric devices as of the type employed for refrigeration by the Peltier effect. In order to illustrate this particular aspect of the invention, the semiconductor compositions of this invention are introduced into a suitable device connected to circuit means electrically connected therewith. In a thermoelectric device, both n- and p-type semiconductor materials are employed in combination electrically and are thermally connected. Referring more specifically to FIG. 4, an n-type semiconductor such as $Cd_2ZnAs_2$ doped with germanium 2 and p-type semiconductor such as $Bi_2Te_3$ 3 are connected electrically by an electrical conductor connector 4. Electrical conductors 5 and 6 are attached to semiconductors 2 and 3, respectively, and to the positive and negattive electrodes of a D.C. power source. Thermally conductive electrical insulator 7 is in contact with electrical conductor 4 and cold junction 9, while thermally conductive electrical insulator 8 is in contact with electrical conductor 5 and 6 and hot junction 10. When D.C. electrical power of the proper polarity is applied to the conductor 5 and 6, heat will be withdrawn from the body 9 and transferred to the body 10. A number of such thermoelectric heat pumping elements may be connected together in series or parallel manner so as to provide heat pumping capacities for refrigerating devices capable of cooling small parts, such as power transistors, or large freezing units, such as domestic food freezers.

It should be noted that if instead of the source of D.C. electrical power shown in FIG. 4 an external load resistance is substituted therefor and a source of heat is applied to one junction of the device while maintaining the other junction at a lower temperature, then an electrical voltage is generated in the device.

I claim:

1. A semiconductive composition of matter having the formula $$Cd_{3-x}Zn_xAs_2$$

where $x$ is a value of from about .1 to about 2.9.

2. A semiconductive composition of matter having the formula $$Cd_{3-x}Zn_xAs_2$$

where $x$ is a value of from .1 to 1.

3. The semiconductive composition of matter having the formula $$Cd_2ZnAs_2$$

4. A process for preparing a semiconductive composition of matter having the formula $$Cd_{3-x}Zn_xAs_2$$

where $x$ is a value from .1 to about 2.9 which comprises heating the elements in a sealed container to a temperature of from about 720° C. to about 1050° C. to render the content molten, maintaining said temperature while mixing the content of the container while in a molten state until a substantially uniform composition results, cooling said composition at a rate of from 2° C. to 20° C. per hour until a temperature of about 400° C. is reached and thereafter cooling at a more rapid rate.

References Cited by the Examiner

UNITED STATES PATENTS

| | | | |
|---|---|---|---|
| 3,016,715 | 1/62 | Pietsch | 62—3 |
| 3,054,842 | 9/62 | Bowers et al. | 136—5 |

OTHER REFERENCES

Hicks et al.: "Thermoelectricity," 1961, pp. 382–387.

Kotovich et al.: "Chemical Abstracts," vol. 52, column 19329 (Nov. 25, 1958).

Stourac et al.: "Chemical Abstracts," vol. 56, column 8122 (April 16, 1962).

Turner et al.: "Physical Review," vol. 121, pp. 759–767 (Feb. 1, 1961).

MAURICE A. BRINDISI, *Primary Examiner.*

WILLIAM J. WYE, ROBERT A. O'LEARY, *Examiners.*